United States Patent

Oda

[11] Patent Number: 6,118,333
[45] Date of Patent: Sep. 12, 2000

[54] CLOCK BUFFER CIRCUIT AND CLOCK SIGNAL BUFFERING METHOD WHICH CAN SUPPRESS CURRENT CONSUMPTION

[75] Inventor: Toshiaki Oda, Tokyo, Japan

[73] Assignee: NEC Corporation, Tokyo, Japan

[21] Appl. No.: 09/183,408

[22] Filed: Oct. 30, 1998

[30] Foreign Application Priority Data

Nov. 14, 1997 [JP] Japan .................................. 9-313341

[51] Int. Cl.[7] .................................................. G06G 7/26
[52] U.S. Cl. ...................... 327/560; 327/292; 327/299; 327/332; 327/387; 327/562; 327/563
[58] Field of Search .................................. 327/560, 562, 327/292, 299, 332, 387, 563

[56] References Cited

U.S. PATENT DOCUMENTS

| | | | |
|---|---|---|---|
| 4,978,872 | 12/1990 | Morse | 327/560 |
| 5,694,386 | 12/1997 | Hirajima et al. | 369/124 |
| 5,812,030 | 9/1998 | Inami | 330/308 |
| 5,914,634 | 9/1998 | Oberhammer | 327/560 |

Primary Examiner—Margaret R. Wambach
Assistant Examiner—Cassandra Cox
Attorney, Agent, or Firm—Scully, Scott, Murphy & Presser

[57] ABSTRACT

A clock buffer circuit includes an amplifier section and a control section. The amplifier section amplifies a clock signal in response to a control signal. The control section generates the control signal based on an amplitude of the clock signal.

21 Claims, 5 Drawing Sheets

CLOCK BUFFER CIRCUIT AND CLOCK SIGNAL BUFFERING METHOD WHICH CAN SUPPRESS CURRENT CONSUMPTION

BACKGROUND OF THE INVENTION

1. Field of the Invention

The present invention relates to a clock buffer circuit and a clock signal buffering method which amplify a clock signal sent to a semiconductor integrated circuit. More particularly, the present invention relates to a clock buffer circuit and a clock signal buffering method which can suppress current consumption.

2. Description of the Related Art

Conventionally, an amplitude of a clock signal sent to a semiconductor integrated circuit is different depending on a supply source of the clock signal. Thus, the clock signal may have an amplitude that is sufficiently large for the operation of the semiconductor integrated circuit or have an amplitude which is not sufficiently large enough for the operation of the semiconductor integrated circuit.

Therefore, a clock buffer circuit is used to amplify the clock signal which is not sufficiently large for the operation of the semiconductor integrated circuit. In the clock buffer circuit, when the clock signal is inputted which is not sufficiently large for the operation of the semiconductor integrated circuit, the clock signal is amplified to the sufficiently high level for the operation of the semiconductor integrated circuit, and the amplified clock signal is inputted to the semiconductor integrated circuit.

However, in a conventional clock buffer circuit, a feedback loop is executed. In this case, even if a clock signal is inputted whose amplitude is large enough that it doesn't need to be amplified, a current corresponding to the clock signal flows through the feedback loop. This results in the useless consumption of electrical power by the current.

Japanese Laid Open Patent Application (JP-A-Heisei 8-130462) discloses a clock buffer circuit as described below. That is, the clock buffer circuit includes a first buffer circuit, a second buffer circuit, a switching circuit and a switch control circuit. The first buffer circuit performs a buffer operation to a first clock signal. The second buffer circuit performs a buffer operation to a second clock signal which is an inverse signal to the first clock signal. The switching circuit is connected between a first clock signal output line connected with an output end of the first buffer circuit, and a second clock signal output line connected with an output end of the second buffer circuit. The switch control circuit operates such that the switching circuit is conducting for a predetermined period when the first and second clock signals are inverted relative to each other, and the switching circuit is not conducting for a period other than the predetermined period.

In the clock buffer circuit, when the first clock signal is inverted from L to H, a part of charges accumulated in parasitic capacitance of the first clock signal output line is transferred through the switching circuit to the side of the second clock signal output line. On the other hand, when the second clock signal is inverted from L to H, a part of charges accumulated in parasitic capacitance of the second clock signal output line is transferred through the switching circuit to the side of the first clock signal output line. As mentioned above, the part of the charges transferred from the parasitic capacitance of the first (second) clock signal output line is used effectively, when the second (first) clock signal is inverted. Correspondingly, the charges (current) to be supplied to the second (first) clock signal output line can be suppressed, when the second (first) clock signal is inverted.

However, the clock buffer circuit disclosed in the abovementioned prior art cannot suppress the useless consumption of the current, when the clock signal whose amplitude is large enough to operate the semiconductor integrated circuit is inputted to the clock buffer circuit.

SUMMARY OF THE INVENTION

The present invention is made to solve the above-described problems in the related arts as mentioned above.

An object of the present invention is to provide a clock buffer circuit in which a useless current is not consumed if a clock signal having a sufficiently high amplitude for an operation of a semiconductor integrated circuit is inputted.

In order to achieve an aspect of the present invention, a clock buffer circuit includes an amplifier section for amplifying a clock signal in response to a control signal, and a control section for generating the control signal based on an amplitude of the clock signal.

In order to achieve another aspect of the present invention, the control section includes an amplitude detecting section for detecting the amplitude of the clock signal, a comparator for comparing the amplitude of the clock signal with a predeterminied value, and a control signal generating section for generating the control signal based on the comparison result.

In this case, the amplifier section includes an amplifier for inputting the clock signal, a line connected between an output and an input of the amplifier, and a switching section provided on the line, and wherein the switching section is turned ON/OFF in response to the control signal.

Also, the switching section includes a P channel MOS transistor and an N channel MOS transistor. In this case, a source of the P channel MOS transistor is connected to a source of the N channel MOS transistor and a drain of the P channel MOS transistor is connected to a drain of the N channel MOS transistor, and wherein an inverter is connected to one of a gate of the P channel MOS transistor and a gate of the N channel MOS transistor, and the control signal is inputted to the inverter and to the other of the gate of the P channel MOS transistor and the gate of the N channel MOS transistor.

Further the amplitude detecting section includes a high level detecting section for detecting a peak voltage in a high level of the clock signal, a low level detecting section for detecting a bottom voltage in a low level of the clock signal, and a voltage difference detecting section for detecting a voltage difference between the peak voltage and the bottom voltage as the amplitude of the clock signal.

In this case, the amplitude detecting section may include a smoothing circuit for smoothing the clock signal to convert it into a direct current voltage corresponding to the amplitude of the clock signal.

Also, the control signal generating section includes a flip-flop, and wherein the flip-flop includes a clock input terminal to which a signal indicative of the comparison result is inputted, a data input terminal to which a data input signal corresponding to a power supply voltage is inputted, a reset input terminal to which a reset signal is inputted, and an inversion output terminal, and wherein the flip-flop outputs the control signal from the inversion output terminal based on the signal indicative of the comparison result, the data input signal and the reset signal.

In order to achieve a still another aspect oh the present invention, a clock signal buffering method includes the steps of comparing a clock signal with a reference signal to generate a control signal generating signal based on the comparison result, generating a control signal based on the control signal generating signal, and outputting the clock signal in response to the control signal.

Also, the comparing step includes detecting an amplitude of the clock signal, and comparing the amplitude of the clock signal with a predetermined value corresponding to the reference signal to generate the control signal generating signal based on the comparison result.

Further, the step of detecting the amplitude of the clock signal includes detecting a peak voltage in a high level of the clock signal, detecting a bottom voltage in a low level of the clock signal, and detecting a voltage difference between the peak voltage and the bottom voltage as the amplitude of the clock signal.

In this case, the step of detecting the amplitude of the clock signal may include smoothing the clock signal to convert it into a direct current voltage corresponding to the amplitude of the clock signal.

Also, the step of outputting the clock signal includes providing an amplifier to which the clock signal is inputted, providing a line connected between an output and an input of the amplifier, providing a switching section provided on the line, and turning the switching section ON/OFF in response to the control signal.

In order to achieve a yet still another aspect of the present invention, a clock buffer circuit includes a unit for comparing a clock signal with a reference signal to generate a control signal generating signal based on the comparison result, a unit for generating a control signal based on the control signal generating signal, and a unit for outputting the clock signal in response to the control signal.

In this case, the comparing unit includes a unit for detecting an amplitude of the clock signal, and a unit for comparing the amplitude of the clock signal with a predetermined value corresponding to the reference signal to generate the control signal generating signal based on the comparison result.

Also, the unit for detecting the amplitude of the clock signal includes a unit for detecting a peak voltage in a high level of the clock signal, a unit for detecting a bottom voltage in a low level of the clock signal, and a unit for detecting a voltage difference between the peak voltage and the bottom voltage as the amplitude of the clock signal.

Further, the unit for detecting the amplitude of the clock signal smooths the clock signal to convert it into a direct current voltage corresponding to the amplitude of the clock signal.

In this case, the unit for outputting the clock signal may include a unit for providing an amplifier to which the clock signal is inputted, a unit for providing a line connected between an output and an input of the amplifier, a unit for providing a switching section arranged on the line, and a unit for turning the switching section ON/OFF in response to the control signal.

Also, a clock buffer circuit includes an amplifier section for amplifying a clock signal, and a control section for generating a control signal based on an amplitude of the clock signal, and wherein a feedback loop which can be set in one of an opened state and a conductive state is arranged in the amplifier section and the feedback loop is set selectively in one of the opened state and the conductive state based on the control signal.

Further, the control section includes an amplitude detecting section for detecting the amplitude of the clock signal, a comparator for comparing the amplitude of the clock signal with a predetermined value, and a control signal generating section for generating the control signal based on the comparison result.

In this case, the amplitude detecting section includes a high level detecting section for detecting a peak voltage in a high level of the clock signal, a low level detecting section for detecting a bottom voltage in a low level of the clock signal, and a voltage difference detecting section for detecting a voltage difference between the peak voltage and the bottom voltage as the amplitude of the clock signal.

Also, the amplitude detecting section includes a smoothing circuit for smoothing the clock signal to convert into a direct current voltage corresponding to the amplitude of the clock signal.

Further, the control signal generating section includes a flip-flop, and wherein the flip-flop includes a clock input terminal to which a signal indicative of the comparison result is inputted, a data input terminal to which a data input signal corresponding to a power supply voltage is inputted, a reset input terminal to which a reset signal is inputted, and an inversion output terminal, and wherein the flip-flop outputs the control signal from the inversion output terminal based on the signal indicative of the comparison result, the data input signal and the reset signal.

In order to achieve another aspect of the present invention, a clock buffer circuit includes an output section for receiving a clock signal, and selectively outputting one of the clock signal and an amplified clock signal obtained by amplifying the clock signal in response to a control signal, and a control section for generating the control signal based on an amplitude of the clock signal, and wherein the output section includes an amplifier for amplifying the clock signal, and a bypassing section for bypassing the amplifier for the clock signal in response to the control signal to prevent the amplifier from being operated.

In order to achieve still another aspect of the present invention, a clock buffer circuit includes a input section for inputting a clock signal, and a control section for controlling a signal path for the clock signal to be set in one of a conductive state and a non-conductive state based on an amplitude of the clock signal.

BRIEF DESCRIPTION OF THE DRAWINGS

A more complete understanding of the teachings of the present invention may be acquired by referring to the accompanying figures, in which like reference numbers indicate like features and wherein.

DESCRIPTION OF THE PREFERRED EMBODIMENTS

Referring now to drawings, various preferred embodiments of the present invention will be described.

Embodiments of the present invention will be described below with reference to the attached drawings.

Figure 1:
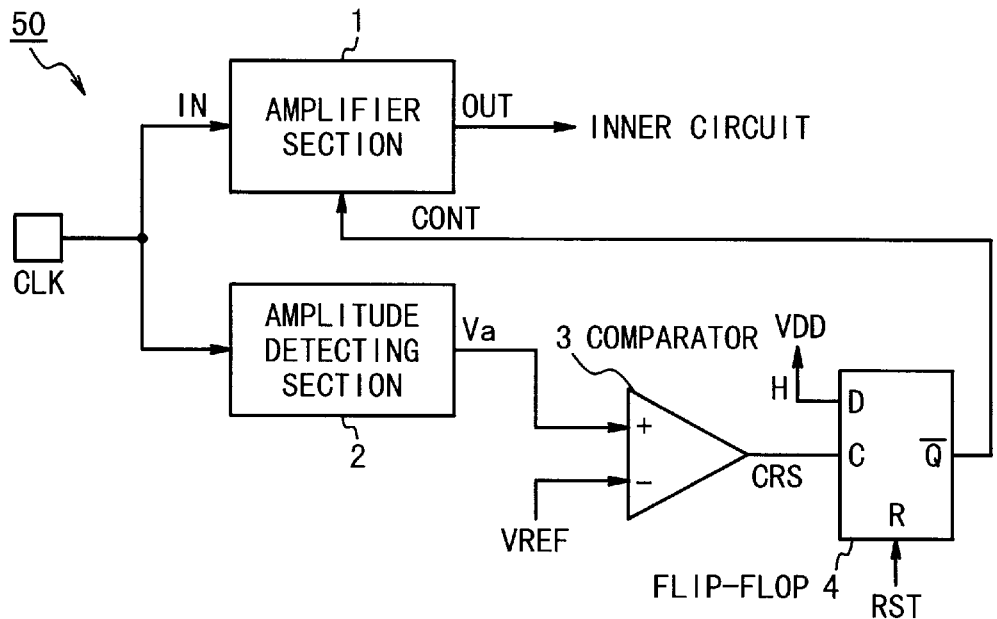
FIG. 1 is a circuit block diagram showing an example of a clock buffer circuit in the present invention.

FIG. 1 is a circuit block diagram showing an embodiment of a clock buffer circuit in the present invention.

As shown in FIG. 1, a clock buffer circuit 50 in this embodiment is provided with an amplifier section 1, an amplitude detecting section 2, a comparator (a comparing device) 3 and a flip-flop 4.

The amplifier section 1 and the amplitude detecting section 2 are connected in parallel. A clock signal CLK is inputted to both the amplifier section 1 and the amplitude detecting section 2. An inner circuit (the semiconductor integrated circuit) is connected in series to a next stage of the amplifier section 1. The comparator 3 is connected in series to a next stage of the amplitude detecting section 2. The flip-flop 4 is connected in series to a next stage of the comparator 3. An output section of the flip-flop 4 is connected in series to the amplifier section 1.

The amplifier section 1 amplifies the clock signal CLK inputted from the outside of the clock buffer circuit 50 to provide an output to an inner circuit.

The amplitude detecting section 2 inputs the clock signal CLK from the outside to generate a voltage corresponding to an amplitude of the clock signal CLK, and to output a signal indicative of the voltage value as an amplitude signal Va.

The comparator 3 compares the voltage corresponding to the amplitude signal Va outputted from the amplitude detecting section 2 with a predetermined comparison voltage VREF. The comparator 3 outputs a comparison result signal (a control signal generating signal) CRS indicative of the comparison result.

The flip-flop 4 receives the comparison result signal CRS outputted from the comparator 3, as a clock input signal CRS, from a clock input terminal C. The flip-flop 4 receives an H level signal corresponding to a power supply voltage VDD, as a data input signal H, from a data input terminal D. The flip-flop 4 receives a reset signal RST inputted from the outside of the clock buffer circuit 50, from a reset input terminal R. The flip-flop 4 outputs, as a control signal CONT, a signal outputted from an inversion output terminal (/Q), based on the clock input signal CRS, the data input signal H and the reset signal RST.

The amplifier section 1 receives the clock signal CLK from the outside, and amplifies the clock signal CLK in response to the control signal CONT outputted from the flip-flop 4 to output the amplified clock signal CLK to the inner circuit.

Figure 2:
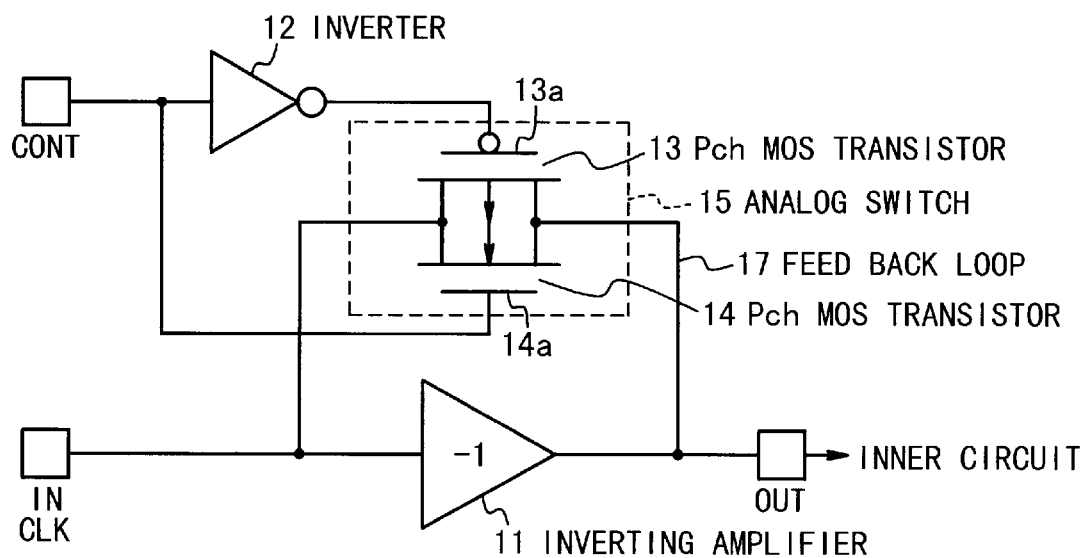
FIG. 2 is a circuit diagram showing a structure example of an amplifier section shown in FIG. 1.

FIG. 2 is a circuit diagram showing a structure example of the amplifier section 1 shown in FIG. 1.

As shown in FIG. 2, the amplifier section 1 includes an inverting amplifier 11, an inverter 12 and an analog switch 15.

The inverting amplifier 11 inverts and amplifies the clock signal CLK inputted from the outside to output to the inner circuit.

The inverter 12 inverts the control signal CONT inputted from the flip-flop 4 to output to the analog switch 15.

In the analog switch 15, the ON/OFF state of the analog switch 15 is switched, based on the control signal CONT outputted from the flip-flop 4 and the signal outputted from the inverter 12. As the ON/OFF state of the analog switch 15 is switched, a feedback loop 17 of the inverting amplifier 11 is generated, or the feedback loop 17 is cut off.

In the analog switch 15, an input terminal of the analog switch 15 is connected to an output side of the inverting amplifier 11, and an output terminal of that is connected to an input side of the inverting amplifier 11. The analog switch 15 includes of a P channel MOS transistor 13 and an N channel MOS transistor 14. A source of the transistor 13 is connected to a source of the transistor 14, and a drain of the transistor 14 is connected to a drain of the transistor 13. An inversion signal of the control signal CONT outputted from the inverter 12 is inputted to a gate 13a of the P channel MOS transistor 13. The control signal CONT is inputted to a gate 14a of the N channel MOS transistor 14.

Figure 3:
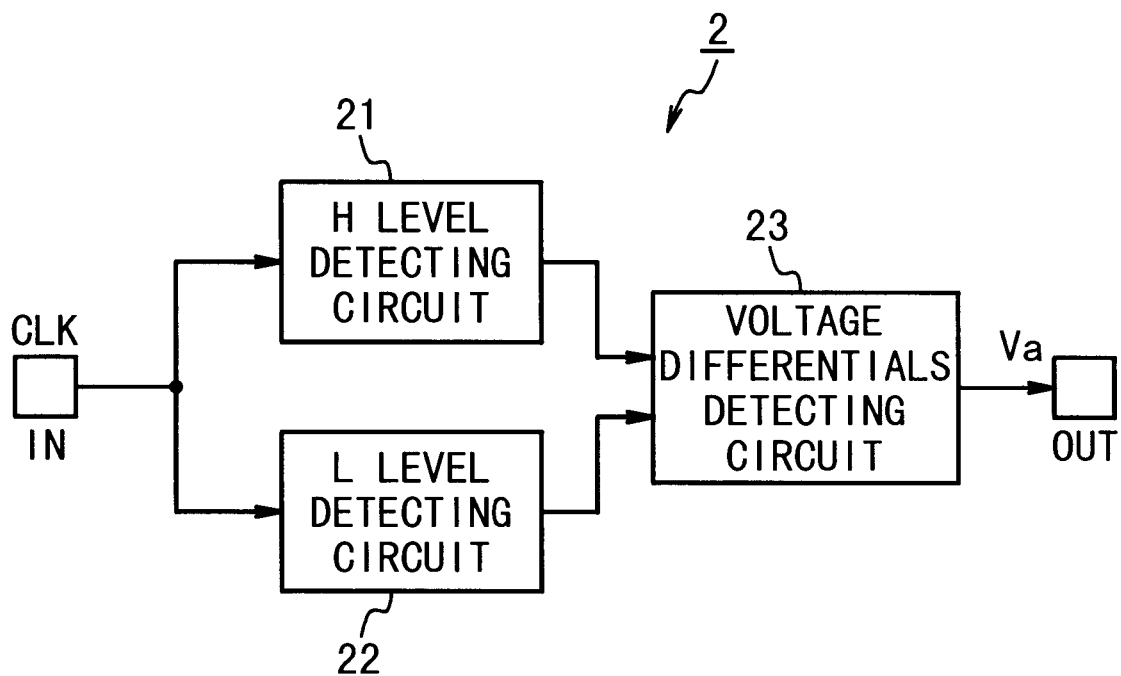
FIG. 3 is a block diagram showing a structure example of an amplitude detecting section shown in FIG. 1.
Figure 4:
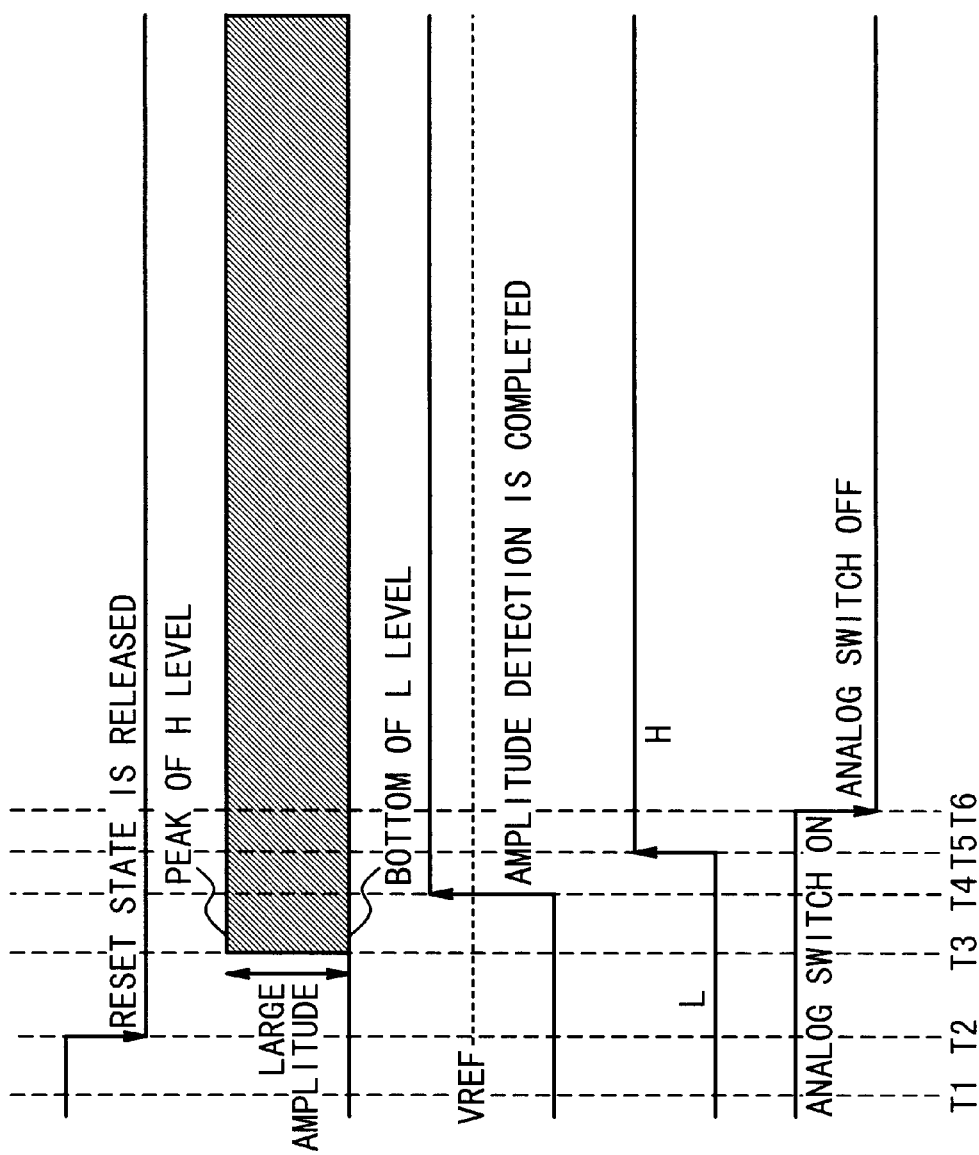
FIG. 4A is a timing chart showing a level of a reset signal RST in the clock buffer circuit of this embodiment.
FIG. 4B is a timing chart showing a level of a clock signal CLK in the clock buffer circuit of this embodiment.
FIG. 4C is a timing chart showing a level of an amplitude detection voltage Va in the clock buffer circuit of this embodiment.
FIG. 4D is a timing chart showing a level of a clock input signal CRS outputted from a comparator in the clock buffer circuit of this embodiment.
FIG. 4E is a timing chart showing a level of a control signal CONT outputted from a flip-flop in the clock buffer circuit of this embodiment.
Figure 5:
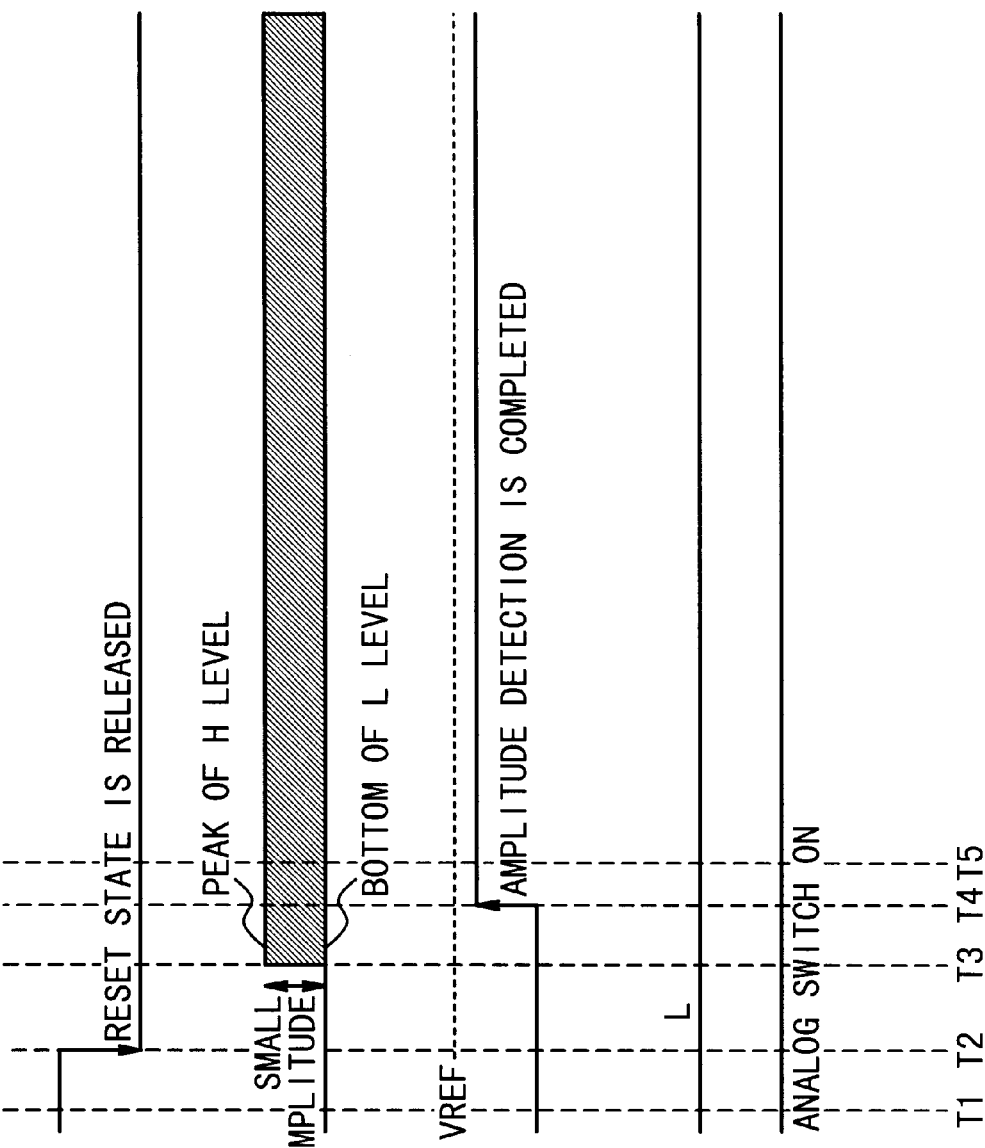
FIG. 5A is a timing chart showing a level of the reset signal RST in the clock buffer circuit of this embodiment.
FIG. 5B is a timing chart showing another level of the clock signal CLK in the clock buffer circuit of this embodiment.
FIG. 5C is a timing chart showing another level of the amplitude detection voltage Va in the clock buffer circuit of this embodiment.
FIG. 5D is a timing chart showing another level of the clock input signal CRS outputted from the comparator in the clock buffer circuit of this embodiment.
FIG. 5E is a timing chart showing another level of the control signal CONT outputted from the flip-flop in the clock buffer circuit of this embodiment.

FIG. 3 is a block diagram showing a structure example of the amplitude detecting section 2 shown in FIG. 1.

As shown in FIG. 3, the amplitude detecting section 2 includes an H level detecting circuit 21, an L level detecting circuit and a voltage differential detecting circuit 23.

The H level detecting circuit 21 detects a peak voltage (H level voltage) of an H level side of the clock signal CLK inputted from the outside. The H level detecting circuit 21 outputs the signal corresponding to the detected H level voltage to the voltage differential detecting circuit 23.

The L level detecting circuit 22 detects a bottom voltage (L level voltage) of an L level side of the clock signal CLK inputted from the outside. The L level detecting circuit 22 outputs the signal corresponding to the detected L level voltage to the voltage differential detecting circuit 23.

The voltage differential detecting circuit 23 detects the difference between the H level voltage and the L level voltage based on the two signals outputted from the H level detecting circuit 21 and the L level detecting circuit 22. The voltage differential detecting circuit 23 outputs the signal indicative of the difference to the comparator 3 as the amplitude signal Va.

Operations of the clock buffer circuit 50 having the above mentioned structure will be described below.

FIGS. 4A to 4E are timing charts to explain the operations of the clock buffer circuit 50 shown in FIGS. 1 to 3.

At first, when an H level signal as the reset signal RST is inputted to the reset input terminal R of the flip-flop 4, the flip-flop 4 is reset (Time T1). Accordingly, an H level signal is outputted, as the control signal CONT, from the inversion output terminal (/Q). Next, when a L level signal as the reset signal RST is inputted to the reset input terminal R at a time T2, the reset state of the flip-flop 4 is released.

Immediately after the L level signal as the reset signal RST is inputted and thereby the reset state of the flip-flop 4 is released (before the clock signal CLK and the clock input signal CRS are inputted), the state of the flip-flop 4 is equal to the reset state. As the result, the H level signal as the control signal CONT is outputted from the inversion output terminal (/Q) of the flip-flop 4 to the amplifier section 1.

When the control signal CONT at the H level is inputted to the amplifier section 1, a L level signal is inputted to the gate 13a of the P channel MOS transistor 13, and also an H level signal is inputted to the gate 14a of the N channel MOS transistor 14. Accordingly, the analog switch 15 becomes in the ON state, and thereby the feedback loop 17 of the inverting amplifier 11 is generated.

If the feedback loop 17 of the inverting amplifier 11 is generated as mentioned above, when the clock signal CLK is amplified by the amplifier section 1, a predetermined current flows through the analog switch 15 constituting the feedback loop of the inverting amplifier 11. In this case, the predetermined current is determined by a resistance in the ON state of the analog switch 15 itself. At this time (before a time T3 described later), the clock signal CLK is not still inputted to the inverting amplifier 11 and the amplitude detecting section 2. As the result, the level of the amplitude signal Va outputted from the amplitude detecting section 2 is fixed to the L level. Therefore, the level of the comparison result signal (the clock input signal) CRS outputted from the comparator 3 is also the L level.

When the clock signal CLK is inputted from the outside at a time T3, the amplitude detecting section 2 detects the peak voltage of the H level of the inputted clock signal CLK and the bottom voltage of the L level of that, respectively. Then, the amplitude detecting section 2 outputs the amplitude signal Va based on the detected results (Time T4).

Next, the comparator 3 compares the voltage corresponding to the amplitude signal Va with the predetermined comparison voltage VREF to output the comparison result signal (the clock input signal) CRS (Time T5).

If the voltage corresponding to the amplitude signal Va is higher than the predetermined comparison voltage VREF, namely, if the amplitude of the clock signal CLK is large enough to operate the semiconductor integrated circuit, the level of the comparison result signal CRS changes from the L level to the H level (Time T5). As the result, the H level signal as the clock input signal CRS is inputted to the clock input terminal C of the flip-flop 4. This causes the power supply voltage VDD to be connected (applied) to an output terminal (Q) (not shown) of the flip-flop 4. Therefore, the level of the output terminal (Q) becomes the H level similarly to the data input signal H. As the result, the level of the signal outputted as the control signal CONT from the inversion output terminal (/Q) changes from the H level to the L level (Time T6).

When the level of the control signal CONT becomes the L level, the H level signal is inputted to the gate 13a of the P channel MOS transistor 13, and further the L level signal is inputted to the gate 14a of the N channel MOS transistor 14. This causes the analog switch 15 to be in the OFF state, and results in the state at which the feedback loop 17 of the inverting amplifier 11 is not generated (cut off) (Time T6).

This state at the time T6 is maintained, until the reset signal RST at the H level is inputted to the reset input terminal R and the flip-flop 4 is reset.

On the other hand, as shown in FIGS. 5A to 5E, if it is judged at the time T4 that the voltage corresponding to the amplitude signal Va outputted from the amplitude detecting section 2 is lower than the predetermined comparison voltage VREF, namely, if the amplitude of the clock signal CLK inputted from the outside is not large enough to operate the semiconductor integrated circuit, the comparison result signal CRS outputted from the comparator 3 remains in the L level (Time T5). As the result, the level of the signal outputted as the control signal CONT from the inversion output terminal (/Q) also remains in the H level.

If the control signal CONT consecutively remains in the H level above-mentioned, the analog switch 15 of the amplifier section 1 also remains in the ON state. Thus, the feedback loop 17 of the inverting amplifier 11 is consecutively generated.

(Another Embodiment)

Figure 6:
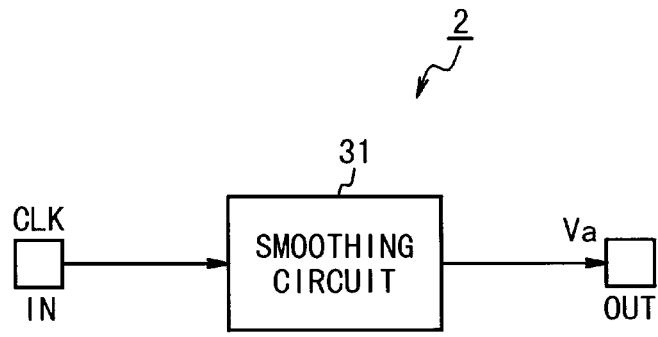
FIG. 6 is a block diagram showing another structure example of the amplitude detecting section shown in FIG. 1.

FIG. 6 is a block diagram showing another structure example of the amplitude detecting section 2 shown in FIG. 1.

As shown in FIG. 6, the amplitude detecting section in a second embodiment is constituted by a smoothing circuit 31. The smoothing circuit 31 smooths the clock signal CLK inputted from the outside, and then converts into a direct current voltage corresponding to an amplitude of the clock signal CLK to output as the amplitude signal Va. The comparator 3 compares the voltage corresponding to the amplitude signal Va outputted from the smoothing circuit 31 with the predetermined comparison voltage VREF. The operations similar to those in the above mentioned embodiment are performed, on the basis of the comparison result.

In this embodiment, when the clock signal CLK is inputted from the outside, the amplitude signal Va corresponding to the amplitude of the inputted clock signal CLK is firstly generated. The amplitude signal Va is compared with a signal indicative of a predetermined standard value. The control signal CONT is generated based on the comparison result. In an amplifier section for amplifying the clock signal CLK, a switch provided in the amplifier section is switched in response to the control signal CONT to suppress the current consumption of the amplifier section.

The amplitude signal Va is generated in the amplitude detecting section 2, and indicates the voltage corresponding to the amplitude of the clock signal CLK. The amplitude signal Va is outputted to the comparator 3. The comparator 3 compares the voltage corresponding to the amplitude signal Va inputted from the amplitude detecting section 2 with the predetermined comparison voltage VREF to generate the control signal CONT corresponding to the comparison result.

The clock signal CLK is amplified on the basis of the control signal CONT, and outputted as a clock signal to the semiconductor integrated circuit. If the clock signal CLK is given through, for example, a condenser coupling connection circuit from a small amplitude oscillator, such as TCXO, the voltage corresponding to the amplitude signal Va can be lower than the predetermined comparison voltage VREF. In this case, the amplifier section 1 functions as the normal clock buffer circuit to generate the feedback loop of the inverting amplifier 11 provided in the amplifier section 1.

On the other hand, if the clock signal CLK is given directly from a device such as a CMOS transistor, the voltage corresponding to the amplitude signal Va can be higher than the predetermined comparison voltage VREF. In this case, the feedback loop of the inverting amplifier 11 is released. Therefore, the useless current is never consumed, if the clock signal CLK whose amplitude is large enough to operate the semiconductor integrated circuit is inputted to the clock buffer circuit 50.

As mentioned above, in this embodiment, the feedback loop of the inverting amplifier 11 provided in the amplifier section 1 is generated if the voltage corresponding to the amplitude signal Va is lower than the predetermined comparison voltage VREF. On the other hand, the feedback loop of the inverting amplifier 11 is released if the voltage corresponding to the amplitude signal Va is higher than the predetermined comparison voltage VREF. Thus, the consumption of current flowing through the clock buffer circuit 50 can be reduced if the clock signal CLK whose amplitude is high enough to operate the semiconductor integrated circuit is inputted to the clock buffer circuit 50.

Figure 7:
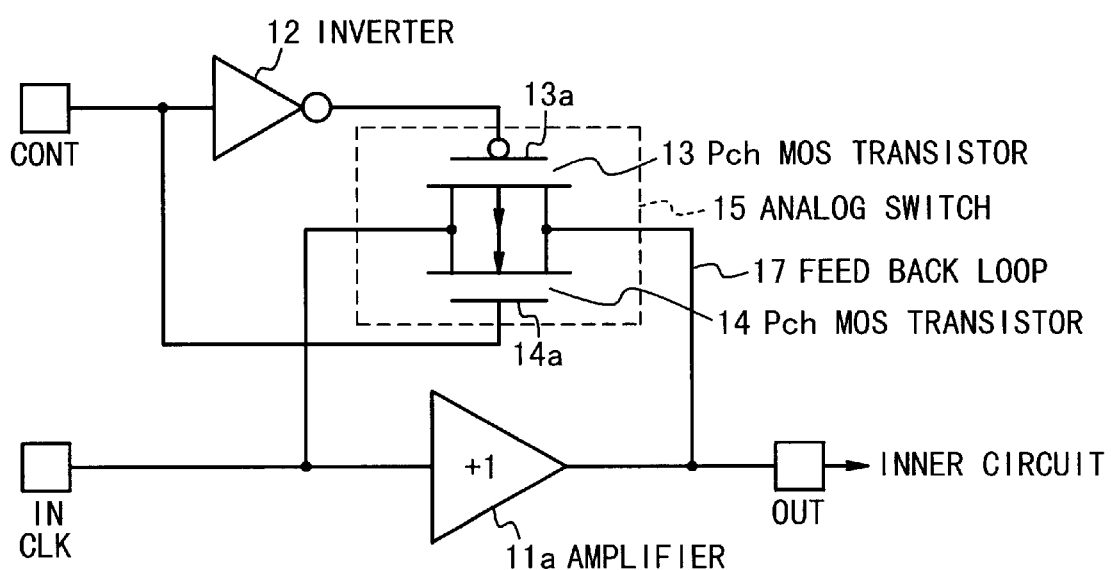
FIG. 7 is a circuit diagram showing a variation example of this embodiment.

Incidentally, as shown in FIG. 7, it may be considered that an inner line 17 (corresponding to the feedback loop 17 in the above-mentioned embodiment) connected between an input side and an output side of an amplifier 11a is used as a bypass line. The clock signal CLK may be bypassed from the amplifier 11a through the bypass line 17, if the amplitude of the clock signal CLK inputted from the outside is high enough for the clock signal CLK not to need to be amplified. This enables the current consumption to be suppressed. In this case, an analog switch 15 and the inner line 17 constitute a bypassing section. The bypassing section bypasses the clock signal CLK from the amplifier 11a to prevent the amplifier 11a from being operated. At this time, the operations of the amplifier 11a and the bypassing sections 15, 17 are selectively performed on the basis of the control signal CONT.

What is claimed is:

1. A clock buffer circuit comprising:
   a. an amplifier section for amplifying a clock signal in response to a control signal; and
   b. a control section for generating said control signal based on an amplitude of said clock signal, said control section comprising,
   an amplitude detecting section for detecting said amplitude of said clock signal,
   a comparator for comparing said amplitude of said clock signal with a Predetermined value, and
   a control signal generating section for generating said control signal based on said comparison result.

2. A clock buffer circuit according to claim 1, wherein said amplifier section comprises:
   an amplifier for receiving said clock signal;
   a line connected between an output and an input of said amplifier; and
   a switching section provided on said line, and
   wherein said switching section is turned ON/OFF in response to said control signal.

3. A clock buffer circuit according to claim 2, wherein said switching section comprises a P channel MOS transistor and an N channel MOS transistor, a source of said P channel MOS transistor being connected to a source of said N channel MOS transistor and a drain of said P channel MOS transistor being connected to a drain of said N channel MOS transistor, and
   wherein an inverter is connected to one of a gate of said P channel MOS transistor or a gate of said N channel MOS transistor, and said control signal is inputted to said inverter and to the other of said gate of said P channel MOS transistor or said gate of said N channel MOS transistor.

4. A clock buffer circuit according to claim 1, wherein said amplitude detecting section comprises:
   a high level detecting section for detecting a peak voltage in a high level of said clock signal;
   a low level detecting section for detecting a bottom voltage in a low level of said clock signal; and
   a voltage difference detecting section for detecting a voltage difference between said peak voltage and said bottom voltage as said amplitude of said clock signal.

5. A clock buffer circuit according to claim 1, wherein said amplitude detecting section comprises a smoothing circuit for smoothing said clock signal to convert said clock signal into a direct current voltage corresponding to said amplitude of said clock signal.

6. A clock buffer circuit according to claim 1, wherein said control signal generating section comprises a flip-flop, and
   wherein said flip-flop comprises:
   a clock input terminal to which a signal indicative of said comparison result is inputted;
   a data input terminal to which a data input signal corresponding to a power supply voltage is inputted;
   a reset input terminal to which a reset signal is inputted; and
   an inversion output terminal, and
   wherein said flip-flop outputs said control signal from said inversion output terminal based on said signal indicative of said comparison result, said data input signal and said reset signal.

7. A clock signal buffering method, comprising the steps of:
   a. comparing a clock signal with a reference signal to generate a control signal generating signal based on said comparison result, wherein the comparing step includes,
   detecting an amplitude of said clock signal, and
   comparing said amplitude of said clock signal with a predetermined value corresponding to said reference signal to generate said control signal generating signal based on said comparison result;
   b. generating a control signal based on said control signal generating signal; and
   c. outputting said clock signal in response to said control signal.

8. A clock signal buffering method according to claim 7, wherein the step of detecting said amplitude of said clock signal includes:
   detecting a peak voltage in a high level of said clock signal;
   detecting a bottom voltage in a low level of said clock signal; and
   detecting a voltage difference between said peak voltage and said bottom voltage as said amplitude of said clock signal.

9. A clock signal buffering method according to claim 7, wherein the step of detecting said amplitude of said clock signal includes smoothing said clock signal to convert into a direct current voltage corresponding to said amplitude of said clock signal.

10. A clock signal buffering method according to claim 7, wherein the step of outputting said clock signal comprises:
    providing an amplifier to which said clock signal is inputted;
    providing a line connected between an output and an input of said amplifier;

providing a switching section provided on said line; and turning said switching section ON/OFF in response to said control signal.

11. A clock buffer circuit comprising:

a. means for comparing a clock signal with a reference signal to generate a control signal generating signal based on said comparison result, wherein the comparing means includes, means for detecting an amplitude of said clock signal, and means for comparing said amplitude of said clock signal with a predetermined value corresponding to said reference signal to Generate said control signal generating signal based on said comparison result;

b. means for generating a control signal based on said control signal generating signal; and c. means for outputting said clock signal in response to said control signal.

12. A clock buffer circuit according to claim 11, wherein said means for detecting said amplitude of said clock signal includes:

means for detecting a peak voltage in a high level of said clock signal;

means for detecting a bottom voltage in a low level of said clock signal; and means for detecting a voltage difference between said peak voltage and said bottom voltage as said amplitude of said clock signal.

13. A clock buffer circuit according to claim 11, wherein said means for detecting said amplitude of said clock signal smooths said clock signal to convert into a direct current voltage corresponding to said amplitude of said clock signal.

14. A clock buffer circuit according to claim 11, wherein said means for outputting said clock signal includes:

means for providing an amplifier to which said clock signal is inputted;

means for providing a line connected between an output and an input of said amplifier;

means for providing a switching section arranged on said line; and means for turning said switching section ON/OFF in response to said control signal.

15. A clock buffer circuit comprising:

an amplifier section for amplifying a clock signal; and a control section for generating a control signal based on an amplitude of said clock signal, and wherein a feedback loop which can be set in one of an opened state or a conductive state is arranged in said amplifier section and said feedback loop is set selectively in one of said opened state or said conductive state based on said control signal.

16. A clock buffer circuit according to claim 15, wherein said control section includes:

an amplitude detecting section for detecting said amplitude of said clock signal;

a comparator for comparing said amplitude of said clock signal with a predetermined value; and a control signal generating section for generating said control signal based on said comparison result.

17. A clock buffer circuit according to claim 16, wherein said amplitude detecting section includes:

a high level detecting section for detecting a peak voltage in a high level of said clock signal;

a low level detecting section for detecting a bottom voltage in a low level of said clock signal; and a voltage difference detecting section for detecting a voltage difference between said peak voltage and said bottom voltage as said amplitude of said clock signal.

18. A clock buffer circuit according to claim 16, wherein said amplitude detecting section includes a smoothing circuit for smoothing said clock signal to convert into a direct current voltage corresponding to said amplitude of said clock signal.

19. A clock buffer circuit according to claim 16, wherein said control signal generating section comprises a flip-flop, and wherein said flip-flop includes:

a clock input terminal to which a signal indicative of said comparison result is inputted;

a data input terminal to which a data input signal corresponding to a power supply voltage is inputted;

a reset input terminal to which a reset signal is inputted; and an inversion output terminal, and wherein said flip-flop outputs said control signal from said inversion output terminal based on said signal indicative of said comparison result, said data input signal and said reset signal.

20. A clock buffer circuit comprising:

an output section for receiving a clock signal, and selectively outputting one of said clock signal or an amplified clock signal obtained by amplifying said clock signal in response to a control signal; and a control section for generating said control signal based on an amplitude of said clock signal, and wherein said output section includes:

an amplifier for amplifying said clock signal; and a bypassing section for bypassing said amplifier for said clock signal in response to said control signal to prevent the amplifier from being operated, wherein the bypassing section comprises a feedback loop which can be set in one of an opened state or a conductive state arranged in said amplifier, and said feedback loop is set selectively in one of said opened state or said conductive state based upon said control signal.

21. A clock buffer circuit, comprising:

an input section for inputting a clock signal; and a control section for controlling a signal path for said clock signal to be set in one of a conductive state or a non-conductive state based on an amplitude of said clock signal, wherein the control section comprises a feedback loop which can be set in one of an opened state or a conductive state arranged in said control section, and said feedback loop is set selectively in one of said opened state or said conductive state based upon said control signal.

* * * * *

UNITED STATES PATENT AND TRADEMARK OFFICE
CERTIFICATE OF CORRECTION

PATENT NO.   : 6,118,333
DATED        : September 12, 2000
INVENTOR(S)  : T. Oda It is certified that error appears in the above-identified patent and that said Letters Patent is hereby corrected as shown below:

Title Page,
Item [56] References Cited, FOREIGN PATENT DOCUMENTS: Insert
-- 8-130462  5/21/1996  JAPAN --

Column 9,
Line 43, "Predetermined" should read -- predetermined --
Line 48: "receiving" should read -- inputting --

Column 11,
Line 13, "Generate" should read -- generate --

Signed and Sealed this

Thirty-first Day of July, 2001

Attest:

NICHOLAS P. GODICI
Attesting Officer    Acting Director of the United States Patent and Trademark Office